United States Patent
Iwasaki

(10) Patent No.: US 9,337,058 B2
(45) Date of Patent: May 10, 2016

(54) METHOD FOR REDUCING NONUNIFORMITY OF FORWARD VOLTAGE OF SEMICONDUCTOR WAFER

(71) Applicant: Shinya Iwasaki, Toyota (JP)

(72) Inventor: Shinya Iwasaki, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/769,011

(22) PCT Filed: Mar. 6, 2013

(86) PCT No.: PCT/JP2013/056112
§ 371 (c)(1),
(2) Date: Aug. 19, 2015

(87) PCT Pub. No.: WO2014/136215
PCT Pub. Date: Sep. 12, 2014

(65) Prior Publication Data
US 2016/0005622 A1    Jan. 7, 2016

(51) Int. Cl.
| | |
|---|---|
| H01L 21/26 | (2006.01) |
| H01L 21/42 | (2006.01) |
| H01L 21/322 | (2006.01) |
| H01L 29/36 | (2006.01) |
| H01L 29/66 | (2006.01) |
| H01L 21/263 | (2006.01) |
| H01L 21/265 | (2006.01) |
| H01L 29/32 | (2006.01) |

(52) U.S. Cl.
CPC ............ *H01L 21/322* (2013.01); *H01L 21/263* (2013.01); *H01L 21/265* (2013.01); *H01L 29/32* (2013.01); *H01L 29/36* (2013.01); *H01L 29/66333* (2013.01)

(58) Field of Classification Search
CPC ...... H01L 29/32; H01L 21/322; H01L 21/265
USPC .................... 438/166, 798; 257/617
See application file for complete search history.

(56) References Cited

U.S. PATENT DOCUMENTS

| | | | |
|---|---|---|---|
| 4,230,791 A * | 10/1980 | Chu et al. ................ | 438/798 |
| 6,828,690 B1 | 12/2004 | Falster | |
| 2008/0079119 A1 | 4/2008 | Inoue | |
| 2012/0007142 A1* | 1/2012 | Nagaoka et al. ........ | 257/140 |

FOREIGN PATENT DOCUMENTS

| | | |
|---|---|---|
| CN | 101159285 A | 4/2008 |
| JP | 2006-108346 A | 4/2006 |
| JP | 2007-251003 A | 9/2007 |
| JP | 2008-091705 A | 4/2008 |
| JP | 2009-239269 A | 10/2009 |

* cited by examiner

*Primary Examiner* — Theresa T Doan
(74) *Attorney, Agent, or Firm* — Oliff PLC

(57) ABSTRACT

There is provided a method for reducing the nonuniformity of forward voltage Vf of an N-type semiconductor wafer in which density of impurities included in an N-layer is nonuniformly distributed in a plane view of the semiconductor wafer. The method reduces the nonuniformity of forward voltage, by irradiating charged particles to the N-type semiconductor wafer, and generating defects in the N-layer to reduce the nonuniformity of forward voltage. In one aspect of the method, charged particles are irradiated so that a reaching positon in a depth direction or an irradiation density may differ according to the density of impurities in the N-layer in the plane view of the semiconductor wafer.

8 Claims, 9 Drawing Sheets

FIG. 9

| Oxygen Content Density [atom/cm3] | Forward Voltage Vf [V] | Reverse Recovery Loss Qrr [$\mu$C] |
|---|---|---|
| 2.0xE+17 | 1.55 | 9.0 |
| 4.0xE+17 | 1.65 | 6.0 |

METHOD FOR REDUCING NONUNIFORMITY OF FORWARD VOLTAGE OF SEMICONDUCTOR WAFER

TECHNICAL FIELD

The present invention relates to a method for reducing the nonuniformity of forward voltage in the plane view of a semiconductor wafer. In this specification, a "semiconductor wafer" may be simply referred to as a "wafer" in order to simplify the description. Moreover, a "P-type semiconductor layer" may be simply referred to as a "P-layer", and an "N-type semiconductor layer" may be simply referred to as an "N-layer".

BACKGROUND ART

There is known a technique called lifetime control which is used in order to shorten reverse recovery time of a diode. This technique uses a technology that irradiates charged particles to a wafer, in which a P-layer and a N-layer are stacked, to intentionally generate crystal defects in the N-layer. Carriers are trapped by the crystal defects, and their lifetime thereby terminates. The charged particles are ions or electrons. As a kind of ions, helium ions or protons are typically selected.

Crystal defects will be outlined. Charged particles irradiated to a wafer eject silicon atoms in a crystal structure, Then, vacancies which lack silicon atoms are formed in the crystal structure. These vacancies are called point defects. The point defects are unstable on their own, and are stabilized by binding to other factors. One aspect of stable defects is called multiple-vacancy defects in which multiple point defects bind to one another. Another aspect of stable defects is called complex defects in which the point defects bind to impurities included in a wafer. That is, complex defects are generated by which the point defects bind to the impurities. Here, "impurities" do not mean substances which determine the conduction type of a semiconductor, but means substances which do not contribute to a conduction type. In this specification, the impurities, which do not contribute to a conduction type but contribute to the stabilization of point defects, are referred to as defect stabilizing impurities, for convenience, in order to distinguish them from impurities that determine the conduction type. Boron and phosphorus are typical examples of the impurities that determine the conduction type, and oxygen and carbon are typical examples of the defect stabilizing impurities.

On the other hand, it is known that lifetime is related to the depth of a defect position in a wafer direction (see JP 2007-251003 A and JP 2009-239269 A). Defect positions in a depth direction of a wafer can be adjusted by energy imparted to charged particles that are irradiated.

SUMMARY OF INVENTION

Conventionally, a diffusion wafer has been widely used in order to produce a diode. On the other hand, with the recent spread of electric vehicles, improvements to inverters have progressed and the development of a semiconductor device in which a transistor element such as an IGBT and a diode are formed on one chip has been studied. This is because a reverse parallel circuit of a transistor and a diode is mostly used for an inverter. A device in which the reverse parallel circuit of an IGBT and a diode is formed on one chip is called a Reverse Conducted IGBT (Insulated Gate Bipolar Transistor) (RCIGBT).

With respect to a wafer on which a transistor such as an IGBT and a diode are formed, a wafer suitable for producing an IGBT is preferably used. The wafer suitable for producing an IGBT is one produced by a Floating Zone (FZ) method or a Magnetic CZ (MCZ) method. That is, a wafer suitable for producing a diode has been different from a wafer suitable for producing an IGBT.

In order to improve the lifetime characteristics of a diode also in an RCIGBT, the inventor of this application uniformly irradiated charged particles to a wafer which was originally used for an IGBT. Subsequently, the inventor has found that the forward voltage Vf of the wafer has nonuniformity which is dependent on a position in the plane view of the wafer. Specifically, forward voltage Vf in a center area, when the wafer is viewed in a plane view, becomes higher than forward voltage Vf in a peripheral area. Forward voltage Vf means the voltage of a boundary at which current abruptly becomes large when voltage gradually increasing in a forward direction is applied to a diode. In a wafer, such as a diffusion wafer, which has been used for a conventional diode, the in-plane nonuniformity of forward voltage Vf has not been observed (it has been very small if observed). However, when charged particles are irradiated to a wafer that has been used for an IGBT, there arises as nonuniformity of forward voltage Vf, which is dependent on a position in the plane of the wafer. Since a plurality of semiconductor devices can be made from one wafer, the nonuniformity of forward voltage Vf is not preferred. The present specification discloses a method for reducing the nonuniformity of forward voltage Vf for a wafer in which a P-layer and an N-layer are stacked.

Despite the fact that the charged particles are uniformly irradiated, the semiconductor wafer has the nonuniformity of forward voltage Vf; with the cause of this nonuniformity investigated, the following knowledge was obtained. A significant difference was found in content densities (concentration) of defect stabilizing impurities between a wafer used for the diode (such as a diffusion wafer and a wafer produced by a CZ method) and a wafer used for the IGBT (produced by the FZ method and the MCZ). In a wafer often used for the diode, the content density of defect stabilizing impurities is roughly larger than $4.0 \times E+17$ [atoms/cm$^3$]. On the other hand, in a wafer often used for the IGBT, the content density of defect stabilizing impurities is roughly smaller than $4.0 \times E+17$ [atoms/cm$^3$]. It is speculated that this difference originates in manufacturing methods of the wafers. Hereafter, a wafer in which the content density of defect stabilizing impurities is roughly larger than $4.0 \times E+17$ [atoms/cm$^3$] is referred to as a high-impurity-density wafer; a wafer in which the content density of defect stabilizing impurities is smaller than $4.0 \times E+17$ [atoms/cm$^3$] is referred to as a low-impurity-density wafer.

Furthermore, according to the inventor's investigation, when defects are generated by irradiating charged particles, the following was clarified: in the high-impurity-density wafer, the density of point defects (this is, after all, equivalent to the density of charged particles that are irradiated) is a dominant factor which determines the density of complex defects; on the other hand, in the low-impurity-density wafer, the density of defect stabilizing impurities is a dominant factor which determines the density of complex defects. Then, it is speculated as follows: in the low-impurity-density wafer, the density of defect stabilizing impurities is nonuniformly distributed in the plane of the wafer; therefore, even if charged particles are uniformly irradiated, there arises the nonuniformity in the density of complex defects, which arises from the nonuniformity of the content density of defect stabilizing impurities; as a result, there arises the nonuniformity of forward voltage Vf.

In the case of the high-impurity-density wafer, even if nonuniformity exists in the distribution of defect stabilizing impurities, the distribution of nonuniformity does not greatly affect the density of complex defects that are generated. This is thought to be due to the following reason: when the density of defect stabilizing impurities is generally high, even if nonuniformity exists, there exist a sufficient number of defect stabilizing impurities to generate complex defects by interacting with almost all the point defects generated by the irradiation of charged particles. Accordingly, in a wafer often used for a diode, influence is not remarkable with respect to the nonuniformity of defect stabilizing impurities in the plane of the wafer; with charged particles uniformly irradiated to the surface of the wafer, substantially uniform forward voltage Vf was obtained over the entire surface of the wafer.

However, in the case of the low-impurity-density wafer for an IGBT, even if charged particles are uniformly irradiated, there exists remarkable influence of the in-plane nonuniformity of defect stabilizing impurities, resulting in the in-plane nonuniformity of forward voltage Vf. As previously mentioned, in a wafer produced by the FZ method or the MCZ method, the density of defect stabilizing impurities is higher in the center area than in the peripheral area in the plane of the wafer; therefore, the forward voltage Vf of the center area becomes higher than the forward voltage Vf of the peripheral area.

Based on the knowledge mentioned above, this specification provides a method for reducing the nonuniformity of forward voltage Vf in the plane of a wafer. In that method, when crystal defects (point defects) are generated by implanting charged particles into the N-layer of the wafer, charged particles are irradiated so that the irradiation density of charged particles irradiated to the center area of the wafer is lower than the irradiation density of charged particles irradiated to the peripheral area of the wafer. Conversely to say, charged particles are irradiated so that the irradiation density of charged particles irradiated to the peripheral area is higher than the irradiation density of charged particles irradiated to the center area. That is, in the peripheral area where the density of defect stabilizing impurities is low, irradiating charged particles with higher density and thus more complex defects are generated. By doing so, the density of complex defects generated in the center area balances with the density of complex defects in the peripheral area, and forward voltage Vf is made uniform in the plane of the wafer. That is, the irradiation of charged particles reduces the nonuniformity of complex defects, resulting in uniform forward voltage Vf. Here, "irradiation density" means the quantity of charged particles irradiated per unit area of a wafer.

Moreover, as previously mentioned, in a wafer in which an N-layer and a P-layer are stacked, it is known that forward voltage Vf depends on the distance of the position of complex defects generated in the N-layer from the P-layer. That is, as the position of complex defects generated in the N-layer is separated away from the P-layer, the forward voltage Vf becomes larger. The position (depth) of generated complex defects is substantially equivalent to the reaching position of implanted charged particles in the depth direction. Consequently, by irradiating charged particles so that the reaching position reached by the charged particles irradiated to the center area of a wafer may become closer to the P-layer than the reaching position reached by the charged particles irradiated to the peripheral area of the wafer, the forward voltage Vf can also be made uniform.

The technology disclosed in this specification can also be applied to a wafer in which the nonuniformity of the density of defect stabilizing impurities is different from the type of nonuniformity mentioned above. For example, when the density of defect stabilizing impurities is low in the center area in the plane view of a wafer and is high in the peripheral area, irradiation may be performed so that the irradiation density of charged particles may become higher in the center area than in the peripheral area. Alternatively, irradiation may be performed so that the reaching position of irradiated charged particles in the depth direction in the wafer may become further away from the P-layer in the center area than in the peripheral area. In order to be able to apply the technology in this specification for the variety of nonuniformity distribution of defect stabilizing impurities, the technology disclosed in this specification can be expressed as follows. This specification discloses a method for reducing the nonuniformity of the forward voltage Vf of a semiconductor wafer in which the density of defect stabilizing impurities included in an N-type semiconductor in the plane view of a semiconductor wafer is nonuniformly distributed. The method for reducing the nonuniformity can be expressed as follows: charged particles are irradiated so that their reaching position in the depth direction or irradiation density may differ according to the density of defect stabilizing impurities. More specifically, the method for reducing the nonuniformity of forward voltage Vf disclosed in this specification can be expressed as follows: charged particles are irradiated so that the reaching position, in the depth direction, of the charged particles irradiated to a first area including defect stabilizing impurities at a first density in an N-layer in the plane view of a wafer is closer to a P-layer than the reaching position of the charged particles irradiated to a second area including defect stabilizing impurities at a second density which is lower than the first density. Alternatively, in the method disclosed in this specification, charged particles may be irradiated so that the irradiation density of charged particles irradiated to the first area is lower than the irradiation density of charged particles irradiated to the second area.

The reaching depth of charged particles can be called a "range". The range depends on energy that is imparted to charged particles. That is, in the case where the imparted energy (acceleration energy) is small, the range becomes short. Accordingly, in order to change the range depending on areas in the plane of a wafer, the charged particles may be irradiated while the imparted energy is being changed. Alternatively, the charged particles with constant energy may be irradiated to a wafer, while the charged particles are caused to pass through a metal plate that has different thicknesses corresponding to areas in the plane of the wafer. Since the energy of charged particles is reduced as the thickness of a metal plate increases, the range of charged particles that are irradiated can be controlled according to the area of a wafer. Such a metal plate is called an absorber. For example, when the density of defect stabilizing impurities is higher in the center area than in the peripheral area, charged particles may be irradiated from an N-layer side through an absorber in which the thickness of an area facing the center area is thinner than the thickness of an area facing the peripheral area. Alternatively, the same effect may be obtained if ions or electrons are irradiated from a P-layer side through an absorber in which thickness of an area facing the center area is thicker than the thickness of an area facing the peripheral area.

It is not necessary to irradiate the charged particles to an entire surface of a wafer. In the case where an IGBT and a diode are formed on an identical wafer, there may be an aspect where the charged particles are irradiated to a prearranged area in which the diode is to be formed and where charged particles are not irradiated to a prearranged area in which the IGBT is to be formed. Even in such a case, charged particles may be irradiated as follows: among a plurality of diode forming prearranged areas which is dispersed over the entire surface of the wafer, the reaching position of the charged particles, which are irradiated to a first prearranged area including impurities in the N-layer at a first density, may become closer to the P-layer than the reaching position of the charged particles irradiated to a second prearranged area including impurities at a second density that is lower than the first density. Alternatively, the charged particles may be irradiated so that the irradiation density of charged particles irradiated to the first prearranged area may be lower than the irradiation density of charged particles irradiated to the second prearranged area.

When a wafer that the in-plane nonuniformity of forward voltage Vf has been reduced by using the technology mentioned above is used, there can be manufactured a plurality of semiconductor devices with uniform forward voltage; this is also one of the technologies disclosed in this specification. In the Embodiments, explanations will be given on the detailed technologies disclosed in this specification and further improvement.

BRIEF DESCRIPTION OF DRAWINGS

FIG. 9 is a view that shows an example of a relationship among the oxygen-content density of a substrate, forward voltage, and reverse recovery loss.

DESCRIPTION OF EMBODIMENTS

Explanations will be given on a method for reducing nonuniformity of forward voltage of a semiconductor wafer, which is disclosed in this specification, with reference to the drawings.

Figure 1A:
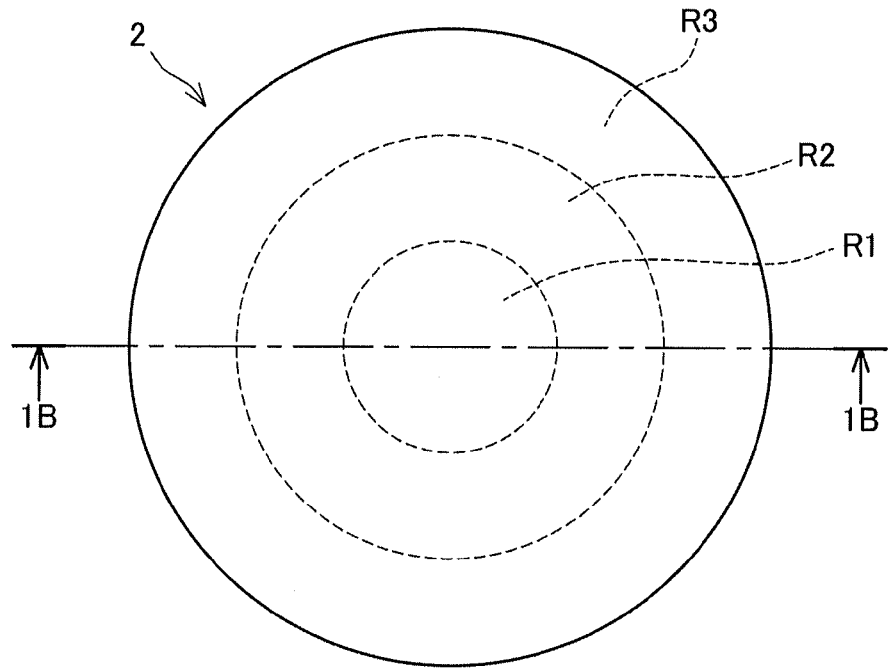
FIG. 1A is a plan view of a wafer.

(First Embodiment) FIG. 1A is a schematic plane view of a wafer 2 (semiconductor wafer) for manufacturing a reverse conducted IGBT (Reverse Conducted Insulated Gate Bipolar Transistor (RCIGBT)) in which an IGBT and a diode are connected in reverse parallel. The wafer 2 is manufactured by, for example, a Floating Zone (FZ) method or a Magnetic CZ (MCZ) method, and the density of defect stabilizing impurities included in an N-layer (N-type semiconductor layer) is smaller than $4.0 \times E+17$ [atoms/cm$^3$]. Here, the defect stabilizing impurities are specifically oxygen molecules or carbon molecules. The wafer 2, in which the density of defect stabilizing impurities is smaller than $4.0 \times E+17$ [atoms/cm$^3$], is referred to as a low-impurity-density wafer.

When the wafer 2 is viewed in a plane view, a center area R1, a peripheral area R3, and an intermediate area R2 therebetween have respective different values for the density of defect stabilizing impurities. The density of defect stabilizing impurities is the highest in the center area R1, is next highest in the intermediate area R2, and is the lowest in the peripheral area R3. In other words, the density of defect stabilizing impurities is higher in the center area R1 than in the peripheral area R3. If the density of defect stabilizing impurities which has a value less than $4.0 \times E+17$ [atoms/cm$^3$] has nonuniformity, the forward voltage Vf has the nonuniformity even when charged particles are uniformly irradiated to the entire surface of a wafer. If the density of defect stabilizing impurities is less than $4.0 \times E+17$ [atoms/cm$^3$], the forward voltage Vf becomes low as the density of defect stabilizing impurities is low. In one example, when helium ions as charged particles are uniformly irradiated to the entire surface of a wafer, forward voltage Vf in the center area R1 is about 0.15 [volt]; forward voltage Vf in the intermediate area R2 is about 0.10 [volt]; and forward voltage Vf in the peripheral area R3 is about 0.05 or less [volt].

Figure 1B:
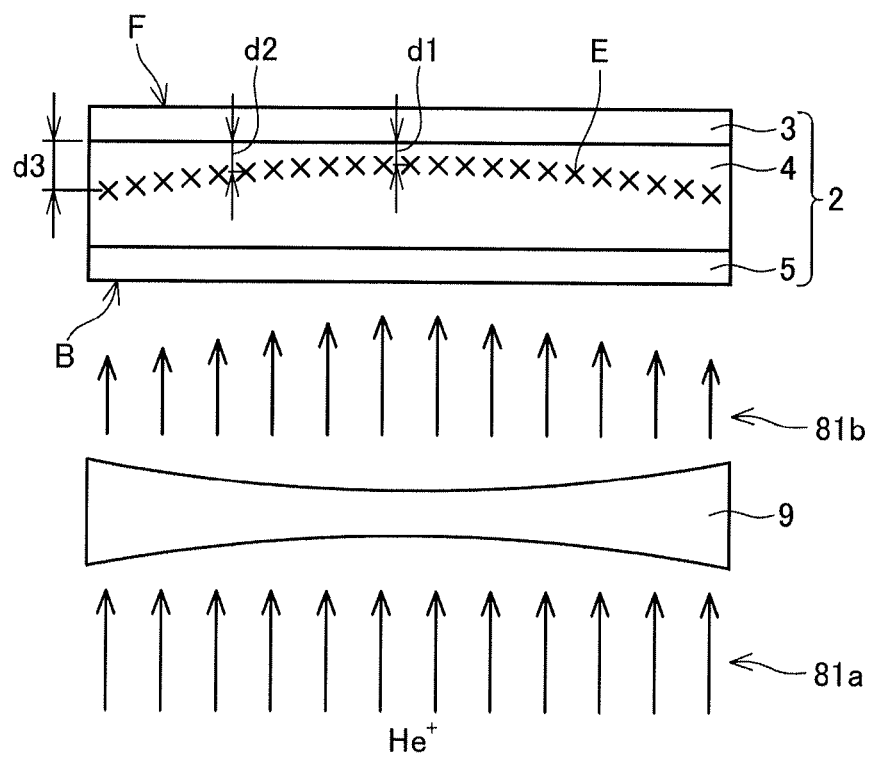
FIG. 1B is a view that explains a method, of a first Embodiment, for reducing nonuniformity.

Explanations will be given on a method, of the first Embodiment, for reducing the nonuniformity of the forward voltage, using FIG. 1B. FIG. 1B is a schematic illustration of a cross section along line 1B-1B in the wafer 2 of FIG. 1A. However, in FIG. 1B, the illustration of hatching representing the cross section is omitted. In the wafer 2, a P-layer 3 (P-type semiconductor layer) and N-layers 4, 5 (N-type semiconductor layers) are stacked. The N-layers are constituted by a N$^+$ layer 5, which has a large content of N-type impurities, and an N$^-$ layer 4 which has a smaller content of N-type impurities than the N$^+$ layer 5. The N$^-$ layer 4 has higher electrical resistance than the N$^+$ layer 5, and the diode of the configuration of FIG. 1B is called a PIN diode. In this specification, the combined form of the N$^-$ layer 4 and the N$^+$ layer 5 is generically called an "N-layer". Explanations will be omitted for the methods of producing the P-layer 3 and the N-layers 4, 5 because they are well known.

In the method of the first Embodiment for reducing the nonuniformity of forward voltage, helium ions (He$^+$) 81a are irradiated to the entire surface of the wafer 2 from the surface B of the N-layer side. The irradiation intensity (acceleration energy) of helium ions is adjusted such that the reaching depth of charged particles reaches a point just before the P-layer 3. In this Embodiment, helium ions are irradiated via a concave-shaped absorber 9. Helium ion irradiation 81a has uniform strength before the absorber 9. The absorber 9 has a concave shape in which the thickness of an area facing the center area R1 of the wafer 2 is thinner than the thickness of an area facing the peripheral area R3. In helium ion irradiation 81b after having passed through the absorber 9 like this, energy is high in the center area RI and energy is low in the peripheral area R3. As a result, the range of helium ions becomes long in the center area R1 and becomes short in the peripheral area R3. In other words, in the method, of the first Embodiment, for reducing the nonuniformity of forward voltage, charged particles are irradiated so that, in the plane view of the wafer 2, a reaching position of the helium ions, in the depth direction, irradiated to the center area R1 may become closer to the P-layer 3 (the boundary between the P-layer and the N-layer) than a reaching position of the helium ions irradiated to the peripheral area R3. The sign E in FIG. 1B shows the reaching position of helium ions. Silicon atoms are ejected at the reaching position of helium ions, generating point defects. Therefore, X marks denoted by the sign E show point defects generated by irradiating helium ions. As shown in FIG. 1B, generated point defects E are close to the P-layer 3 in the center area R1 and become separated from the P-layer 3 at greater degree toward the periphery thereof. Generated point defects E have distribution in the depth direction, but the distribution width of the reaching position of the helium ions in the depth direction is extremely small (for example, about 1.0 micron) and the position of a peak may be regarded as the reaching position of the helium ions.

As previously mentioned, point defects are not stable and are stabilized by binding to defect stabilizing impurities existing in the vicinity. A defect in which a point defect and a defect stabilizing impurity are bound is called a complex defect. All the point defects formed by irradiating helium ions do not necessarily become complex defects. In particular, in the case of the wafer 2, the density of defect stabilizing impurities differs depending on areas; in the center area R1 where the density is high, complex defects are generated with a high probability; in the peripheral area R3 where the density is low, complex defects are generated with a low probability. "Defects E" in the figure mean point defects immediately after the irradiation of helium ions, but they also mean complex defects because part of the point defects bind to defect stabilizing impurities.

Figure 2:
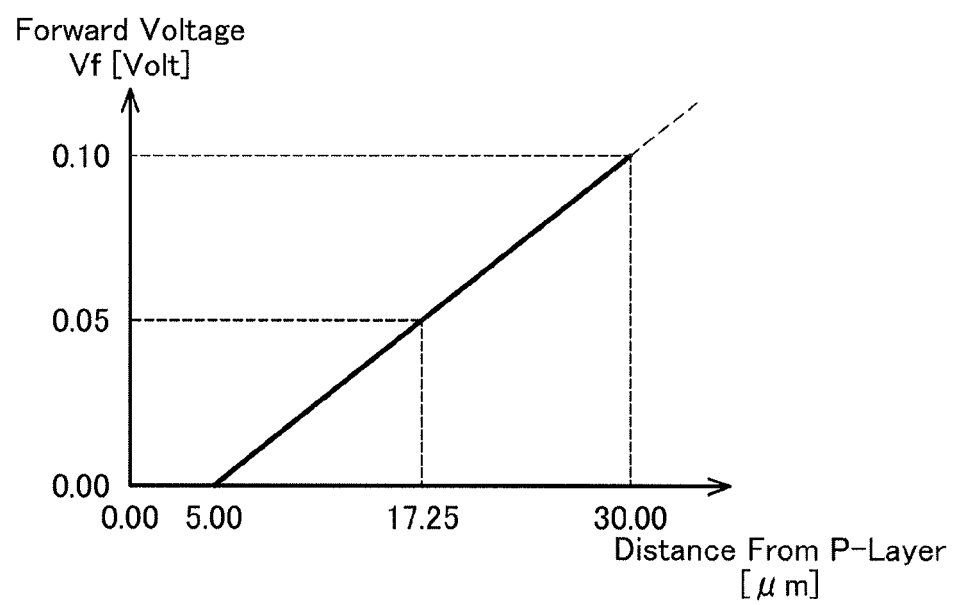
FIG. 2 is a graph that shows an example of a relationship between forward voltage and a distance of a reaching position of charged particles from a P-layer.

On the other hand, forward voltage Vf differs depending on a distance between the reaching position of the helium ions and the P-layer. FIG. 2 shows an example of a relationship between with forward voltage Vf and a distance of the reaching position of the charged particles from the P-layer. The graph of FIG. 2 is based on experimental results obtained by uniformly irradiating helium ions to a high-impurity-density wafer in which the generation probability of complex defects does not depend on the density of defect stabilizing impurities. In this example, the forward voltage Vf is approximately zero when the reaching position of the ion particles is 5 microns or less from the P-layer; the forward voltage Vf becomes 0.05 volts when the distance from the P-layer is 17.5 microns; the forward voltage Vf becomes 0.10 volts when the distance from the P-layer is 30 microns.

As previously mentioned, when helium ions are uniformly irradiated to the wafer 2, forward voltage Vf becomes about 0.15 volts in the center area R1; about 0.10 volts in the intermediate area; and about 0.05 volts in the peripheral area R3. Therefore, the forward voltage Vf after ion irradiation becomes roughly constant over the entire surface of the wafer if the thickness of the absorber 9 is adjusted so that a distance d between the reaching position of the helium ions and the P-layer may satisfy the following conditions: the distance d1 equals 0.05 microns or less in the center area R1; distance d2 equals 0.10 microns in the intermediate area R2; and distance d3 equals 0.30 microns in the peripheral area R3. FIG. 1B shows that the distance d between the reaching position of the helium ions E and the P-layer is the shortest in the center area R1, and is second longest in the intermediate area R2, and is the longest in the peripheral area R3. The irradiation intensity of helium ions is constant in the circumferential direction of the wafer. The irradiated helium ions have convex-shaped distribution in which the central part projects toward the P-layer side.

Figure 3:
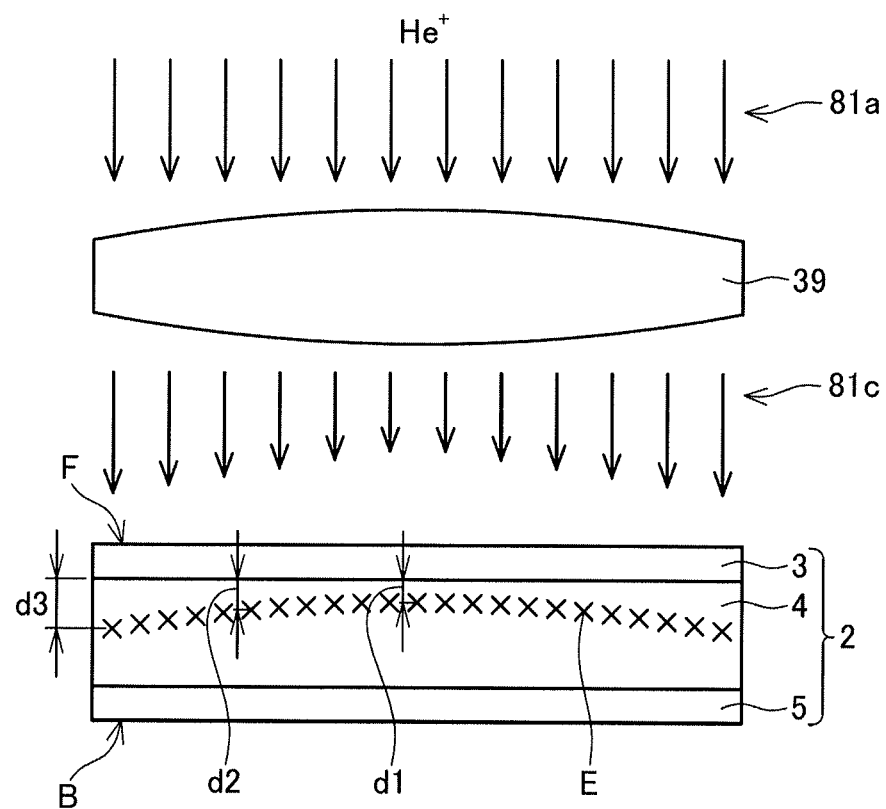
FIG. 3 is a view that explains a method, of a variation of the first Embodiment, for reducing nonuniformity.

Next, explanations will be given on the variation of the first Embodiment with reference to FIG. 3. In the first Embodiment, helium ions were irradiated from the N-layer side of the wafer 2. At that time, helium ions were irradiated from the surface B of the N-layer side through the absorber 9 in which the thickness of an area facing the center area R1 is thinner than the thickness of an area facing the peripheral area R3. The uniform helium ion irradiation 81a is converted to the helium ion irradiation 81b after having passed through the absorber 9; the helium ion irradiation 81b reaches the wafer 2 with the energy of helium ions irradiated to the center area becoming higher than the energy of helium ions irradiated to the peripheral area. As a result, there can be obtained the distribution of defects E in which defects are close to the P-layer in the center area R1 and become far away from the P-layer in the peripheral area R3. The same effect can be obtained by irradiating helium ions from the surface F of the P-layer side through an absorber 39 in which the thickness of an area facing the center area R1 is thicker than the thickness of an area facing the peripheral area R3 (see FIG. 3). The uniform helium ion irradiation 81a is reaches the wafer 2 so that the energy of helium ions irradiated to the center area R1 becomes lower than the energy of helium ions irradiated to the peripheral area R3 (irradiation 81c). As a result, there can be obtained the distribution of defects E in which defects are close to the P-layer in the center area R1 and become far away from the P-layer in the peripheral area R3. FIG. 3 shows that the distance d1 between the reaching position of the helium ions in the center area R1 and the P-layer is shorter than the distance d3 between the reaching position of the helium ions in the peripheral area R3 and the P-layer.

Figure 4A:
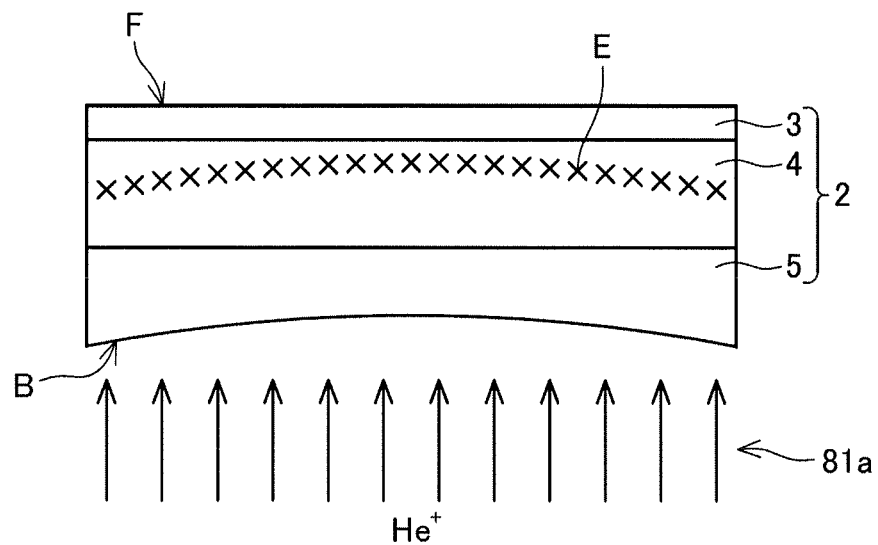
FIG. 4A is a view that explains a method, of a second Embodiment, for reducing nonuniformity (1)

(Second Embodiment) Next, explanations will be given on a method, of the second Embodiment, for reducing the nonuniformity of forward voltage with reference to FIGS. 4A and 4B. In this Embodiment, a wafer 42 is prepared, the wafer 42 in which the thickness of the N-layer (in particular, the $N^+$ layer 5 including N-type impurities at a high density) is thin in the center area where the density of defect stabilizing impurities is low and is thick in the peripheral area where the density of defect stabilizing impurities is high. The helium ions 81a with uniform energy are irradiated to the entire surface of the wafer from the surface B of the N-layer side of the wafer 42 (see FIG. 4A). Since the energy of helium ions is constant, the range of helium ions is located at a constant depth from the surface B of the N-layer. However, since the thickness of the N-layer is thin in the center area and is thick in the peripheral area, the distance between the reaching position of the helium ions and the P-layer (the border of the P-layer and the N-layer) becomes short in the center area and becomes long in the peripheral area. That is, defects E generated by irradiating helium ions has distribution in which the defects E are close to the P-layer 3 in the center area and become separated away from the P-layer at greater degree toward the periphery.

Figure 4B:
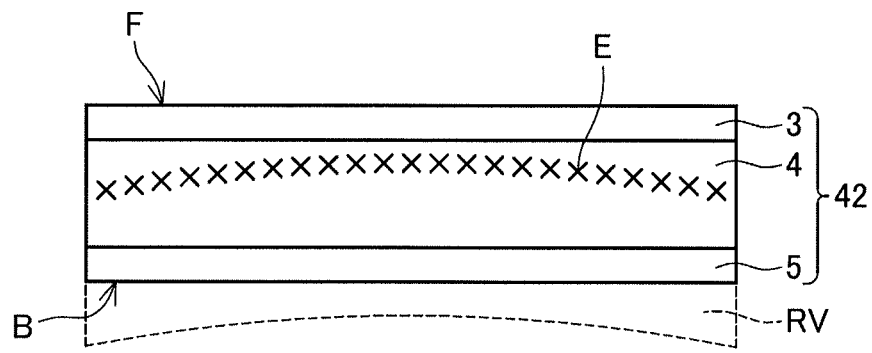
FIG. 4B is a view that explains a method, of the second Embodiment, for reducing nonuniformity (2)

Next, as shown in FIG. 4B, the surface of the N-layer side is scraped off flatly. In FIG. 4B, a broken-line portion denoted by a sign RV represents a portion to be scraped off. When the surface of the N-layer side is scraped off, a wafer in which the nonuniformity of forward voltage Vf is suppressed is obtained, similarly to the first Embodiment.

Figure 5A:
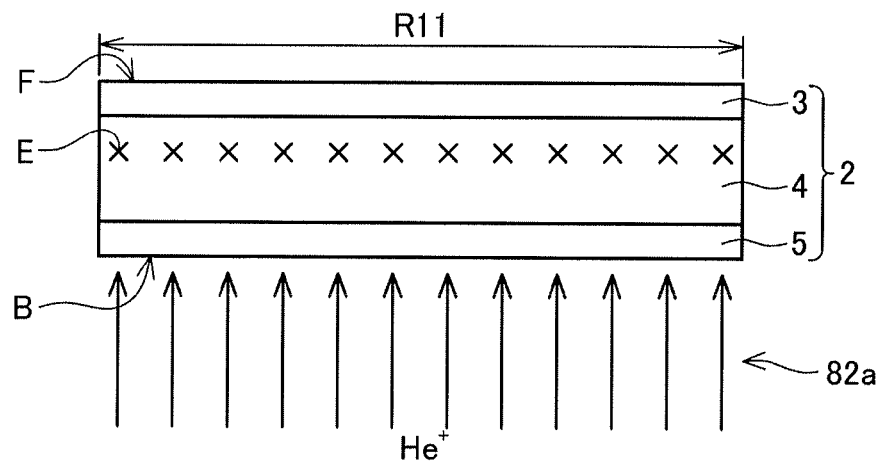
FIG. 5A is a view that explains a method, of a third Embodiment, for reducing nonuniformity (first time irradiation)
Figure 5B:
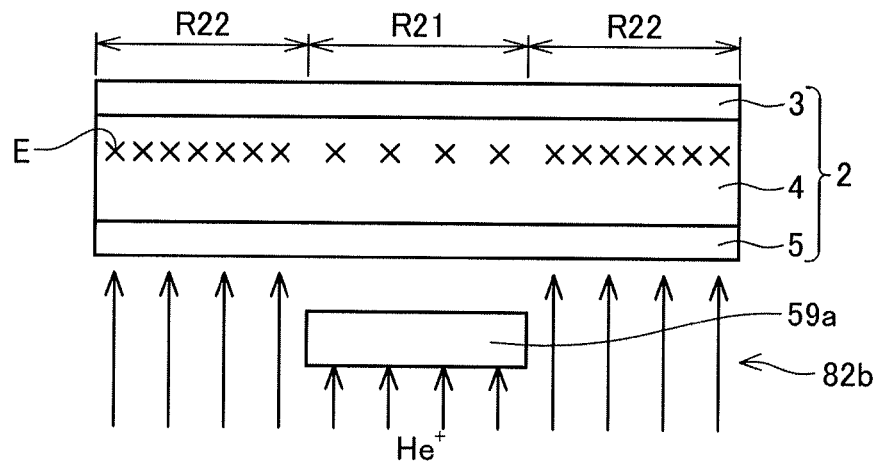
FIG. 5B is a view that explains a method, of the third Embodiment, for reducing nonuniformity (second time irradiation)
Figure 5C:
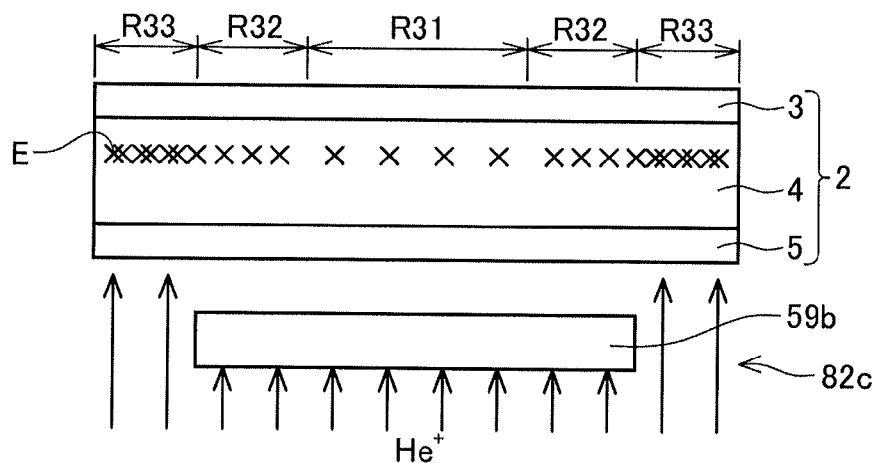
FIG. 5C is a view that explains a method, of the third Embodiment, for reducing nonuniformity (third time irradiation)
Figure 6:
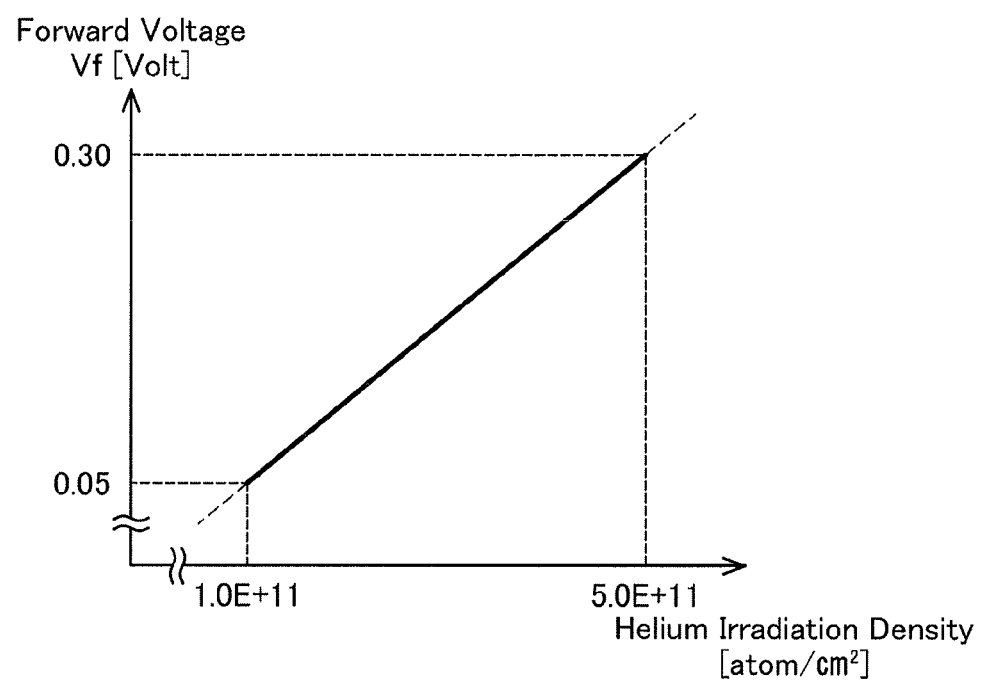
FIG. 6 is a graph that shows an example of a relationship between forward voltage and the irradiation density of helium ions.

(Third Embodiment) Next, explanations will be given on a method, of the third Embodiment, for reducing nonuniformity with reference to FIGS. 5A to 5C. The wafer 2 is the same type as the wafer shown in FIG. 1A; in the N-layer, the density of defect stabilizing impurities is high in the center area and is low in the peripheral area. In this Embodiment, the irradiation density of helium ions is made low in the center area where the density of defect stabilizing impurities is high; the irradiation density of helium ions is made high in the peripheral area where the density of defect stabilizing impurities is low. It should be noted that an irradiation density means the quantity of helium ions irradiated per unit area of a wafer. FIG. 6 illustrates one example of a relationship between an irradiation density and forward voltage W.

The energy of helium ions that are irradiated may be constant over the entire surface of the wafer. With high-density helium ions irradiated to the peripheral area where the density of defect stabilizing impurities is low, the possibility of producing complex defects is made high, creating a balance with the density of complex defects generated in the center area.

Explanations will be given on a method for making the density of helium ions differ in the plane of a wafer, using FIGS. 5A to 5C. In this example, helium ions with constant energy are irradiated three times. At the first time, helium ions 82a with constant energy are irradiated to the entire surface of the wafer. As a result, a surface density of ions implanted in the entire area R11 of the wafer becomes constant (see FIG. 5A).

Next, helium ions 82b with constant energy are irradiated through a first shield plate 59a, with a small diameter, which covers only the center area of the wafer 2. The first shield plate 59a does not make helium ions pass therethrough. Therefore, in a region covered with the first shield plate 59a, helium ions do not reach the wafer 2, and the density of implanted helium ions remains at the same level as the first time of irradiation. On the other hand, in a region that is not covered with the first shield plate 59a, since the helium ions 82b of the second time irradiation reach the wafer 2, the density of implanted helium ions increases (see FIG. 5B). In FIG. 5B, the density of helium ions in the peripheral area R22 becomes higher than the density of helium ions in the center area R21.

Next, helium ions 82c with constant energy are irradiated through a second shield plate 59b that has a larger diameter than the first shield plate 59a. The second shield plate 59b does not make helium ions pass therethrough either; therefore, helium ions do not reach the wafer 2 in a region covered with the second shield plate 59b, and the density of implanted helium ions remains at the same level as the second time of irradiation. On the other hand, in a region that is not covered with the second shield plate 59b, since the helium ions 82c of the third time of irradiation reach the wafer 2, the density of implanted helium ions further increases (see FIG. 5C). After all, the density of implanted helium ions is the lowest in the center area R31, and is next higher in the intermediate area R32 that is the surrounding of the center area R31, and is the highest in the peripheral area R33 that is the surrounding of the intermediate area R32 (see FIG. 5C). In this way, distribution in which the density of implanted helium ions is the lowest in the center area and becomes higher as toward the periphery can be realized. As previously mentioned, point defects E are generated at the reaching position of the helium ions. In the peripheral area, the density of defect stabilizing impurities is lower compared to the center area, but the density of point defects is higher compared to the center area; therefore, the resultant density of complex defects that are generated is made uniform among the center area and the peripheral area. As a result, the in-plane nonuniformity of forward voltage Vf can be suppressed.

Figure 7A:
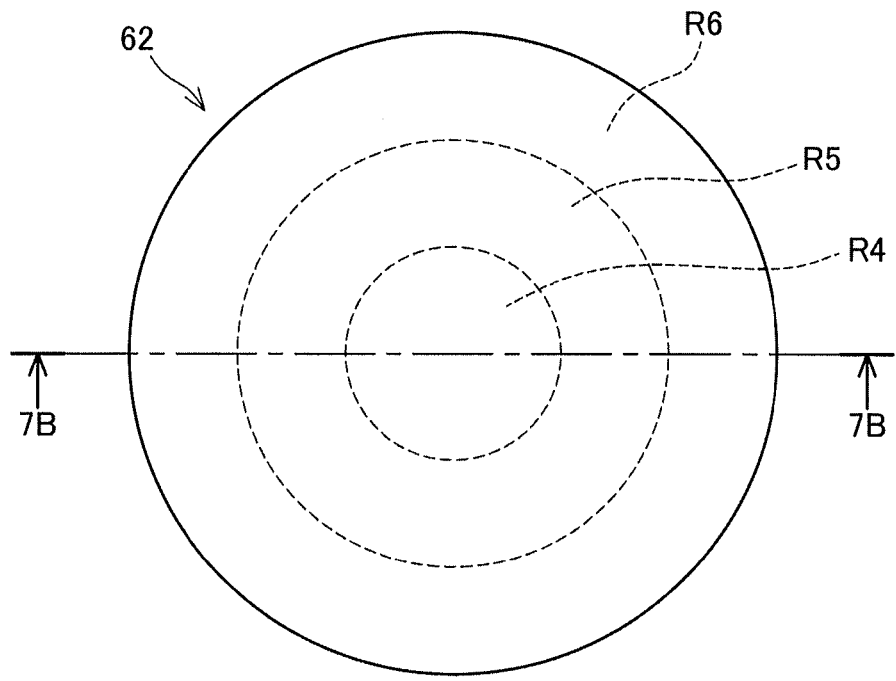
FIG. 7A is a plan view of a wafer that has the different distribution of defect stabilizing impurities.
Figure 7B:
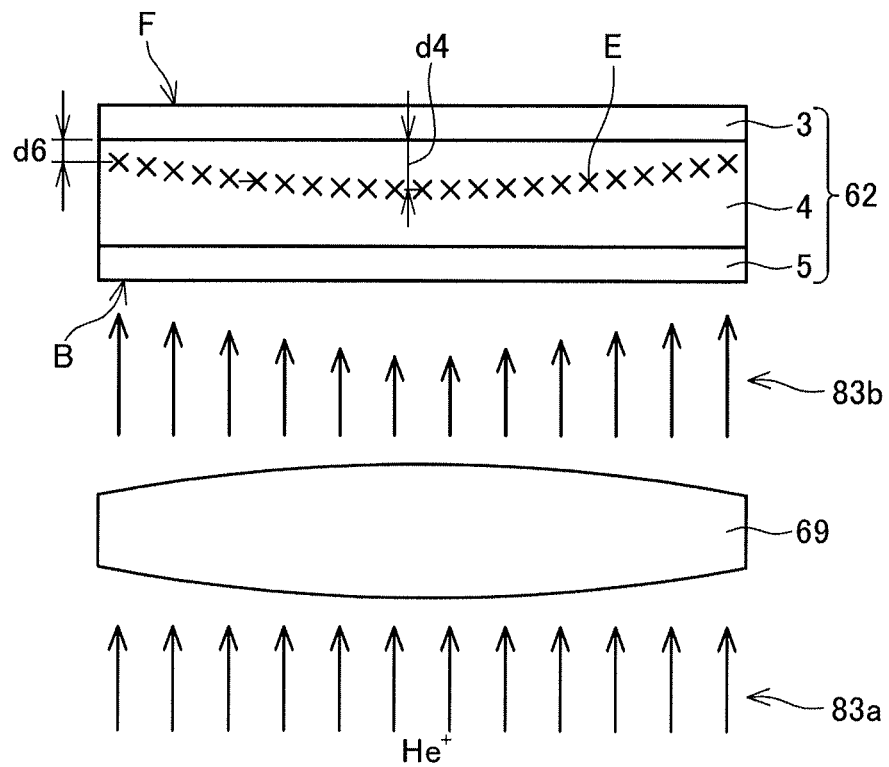
FIG. 7B is a view that explains an example of a method for reducing the nonuniformity of forward voltage for the wafer of FIG. 6A (fourth Embodiment)

(Fourth Embodiment) Next, explanations will be given on a method, of the fourth Embodiment, for reducing the nonuniformity of forward voltage. In the fourth Embodiment, the present technology is applied to a wafer in which the distribution of defect stabilizing impurities is different from that of the wafers used in the first to third Embodiments. With respect to a wafer 62 shown in FIG. 7A, and in the plane view of the wafer 62, the density of defect stabilizing impurities in the N-layer is the lowest in the center area R4, and is next higher in the intermediate area R5, and is the highest in the peripheral area R6. Therefore, when helium ions with constant energy are irradiated to the entire surface of this wafer 62, there arises nonuniformity in which forward voltage Vf becomes low in the center area R4 and becomes higher as toward the periphery. Accordingly, in this Embodiment, uniform helium ions 83a are irradiated from the side of the surface B of the N-layer through an absorber 69 in which the thickness of an area facing the center area R4 is thicker than the thickness of an area facing the peripheral area R6 (see FIG. 7B). FIG. 7B is a schematic illustration of a cross section along line 7B-7B in the wafer 2 of FIG. 7A. However, in FIG. 7B, the illustration of hatching representing the cross section is omitted.

The irradiation of helium ions 83b after having passed through the absorber 69 has distribution in which energy is low in the center area and is high in the peripheral area. When these helium ions are irradiated, the wafer 62 has distribution that the reaching position of the helium ions is most distant from the P-layer 3 (the border of the P-layer and the N-layer) in the center area R4 and becomes closer to the P-layer 3 as the periphery is approached. The reaching position of the helium ions is equivalent to the position of complex defects. With respect to this wafer 62, in the center area R4, the density of complex defects E is low, but the position of the complex defects E is distant from the P-layer 3; whereas on the other hand, in the peripheral area R6, the density of complex defects E is high, but the position of the complex defects E is close to the P-layer 3. The fact that the position of complex defects E is distant from the P-layer 3 tends to increase forward voltage Vf. Therefore, the fact that the density of defect stabilizing impurities is low in the center area R4 and is high in the peripheral area R6, and the fact that the distance from the P-layer to the reaching position of the helium ions is distant in the center area R4 and is close in the peripheral area R6, cancels contribution to forward voltage Vf; as a result, the in-plane nonuniformity of forward voltage Vf is suppressed.

The wafer 2 used in the first to the third Embodiments and the wafer 62 used in the fourth Embodiment are both low-impurity-density wafers, but the in-plane distribution of these wafers differs with respect to defect stabilizing impurities included in the N-layer. However, the technology disclosed in this specification is applicable to any wafers that have different nonuniformity in the distribution of defect stabilizing impurities. That is, the technology disclosed in this specification provides a method for reducing the nonuniformity of the forward voltage Vf of a wafer in which the distribution of defect stabilizing impurities in the N-layer is nonuniformly distributed in the plane of the wafer. For example, when the density of defect stabilizing impurities is low in the center area and is high in the peripheral area in the plane view of the wafer, irradiation may be performed so that the irradiation density of charged particles may be higher in the center area than in the peripheral area. Alternatively, charged particles may be irradiated so that the reaching position of irradiated charged particles in the depth direction may become further away from the P-layer in the center area than in the peripheral area. If the nonuniformity of defect stabilizing impurities is generalized, the technology disclosed in this specification is expressed as follows. The technology disclosed in this specification relates to a method for reducing the nonuniformity of forward voltage Vf in the plane of a wafer. More specifically, the technology relates to a method for reducing the nonuniformity of forward voltage, which includes irradiating charged particles to a semiconductor wafer, in which a P-type semiconductor layer and an N-type semiconductor layer are stacked, to generate defects in the N-type semiconductor layer. The technology disclosed in this specification is particularly suitable for a wafer in which the density of defect stabilizing impurities included in the N-layer is smaller than $4.0 \times E+17$ [atoms/cm$^3$]. In that method, charged particles are irradiated so that the reaching position of the depth direction or an irradiation density may differ according to the density of impurities in the plane view of a semiconductor wafer. More specifically, in the method disclosed in this specification, ions are irradiated so that, in the plane view of a semiconductor wafer, the reaching position in the wafer's depth direction reached by ions (charged particles) irradiated to the first area including impurities in the N-layer at the first density may be closer to the P-layer than the reaching position reached by ions irradiated to the second area including impurities at the second density that is lower than the first density. Alternatively, ions may be irradiated so that the irradiation density of ions irradiated to the first area may be lower than the irradiation density of ions irradiated to the second area. The above expression includes the first to fourth Embodiments. In the first to third Embodiments, the center area corresponds to an example of the first area, and the peripheral area corresponds to an example of the second area. Moreover, in the fourth Embodiment, the peripheral area corresponds to an example of the first area, and the center area corresponds to an example of the second area.

Figure 8:
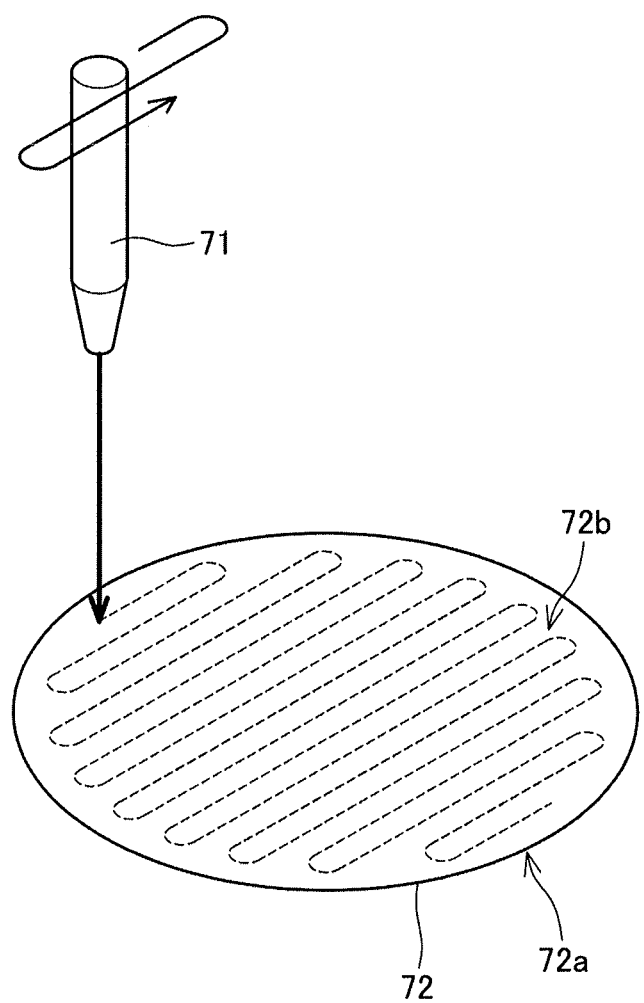
FIG. 8 is a view that explains a method, of a fifth Embodiment, for reducing nonuniformity.

(Fifth Embodiment) Explanations will be further given on another Embodiment of the technology disclosed in this specification, with reference to FIG. 8. In the technology disclosed in this specification, the energy of or the density of helium ions that are irradiated is changed according to the density of defect stabilizing impurities in each area in the plane of a wafer. That method can be realized with a device configured to scan a beam gun 71, which irradiates a helium ion beam, in the plane of the wafer. The beam gun 71 of FIG. 8 can irradiate the helium ion beam from the surface 72b of the N-layer side of the wafer 72 while performing scanning on the wafer. When a scanning speed is made slow, the density of ions (that is, the density of generated point defects) becomes high. When the energy of the beam is intensified, a range becomes large, and the position of generated point defects becomes close to the P-layer. Therefore, by using the beam gun 71, the same result as the first to fourth Embodiments can be obtained.

Points to note about the technology described in the Embodiments will now be mentioned. In the Embodiments, helium ions are irradiated to the N-layer of a low-impurity-density wafer to generate point defects. Irradiated charged particles are not limited to helium ions. Irradiated charged particles may be protons or electrons.

Irradiating charged particles may not be performed to the entire surface of a wafer. When an RCIGBT is made, charged particles may be discretely generated for an area in which a diode is formed. Even in that case, to an area where the content density of defect stabilizing impurities is high, charged particles are irradiated at a higher density compared with an area where the content density of defect stabilizing impurities is low. Or, to an area where the content density of defect stabilizing impurities is high, charged particles are irradiated so as to reach a position closer to the P-layer compared with an area where the content density of defect stabilizing impurities is low.

With the use of a wafer in which the in-plane nonuniformity of forward voltage Vf has been suppressed by means of any of the Embodiments described above, the nonuniformity of the forward voltage characteristics for a plurality of RCIGBTs made from one wafer can be reduced.

As fundamental data, a detailed example will be presented about a relationship between the content density of impurities and forward voltage Vf, wherein oxygen, which is a kind of impurity, is used as an example. FIG. 9 shows the measured results of forward voltage Vf and reverse recovery loss Qrr for two semiconductor wafers, which have the content density of oxygen of $2.0 \times E+17$ [atoms/cm$^3$] and of $4.0 \times E+17$ [atoms/cm$^3$], respectively. The results of FIG. 9 were obtained by averaging several measured values. As is understood from FIG. 9, a high content density of oxygen tends to increase forward voltage. In an example, if there is a two times difference in the content density of oxygen, there arises a difference of 0.1 [V] in forward voltage. According to the measurement of the inventors, in one sample of a semiconductor wafer, two areas which have an oxygen content of $2.0 \times E+17$ [atoms/cm$^3$] and of $4.0 \times E+17$ [atoms/cm$^3$], respectively, were observed.

Moreover, as shown in FIG. 9, there exists a specific relationship between the content density of oxygen and reverse recovery loss. The increasing content density of oxygen tends to decrease reverse recovery loss.

Representative, non-limiting examples of the present invention have been described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed above may be utilized separately or in conjunction with other features and teachings to provide improved method for reducing nonuniformity of forward voltage of a semiconductor wafer.

Moreover, combinations of features and steps disclosed in the above detail description may not be necessary to practice the invention in the broadest sense, and are instead taught merely to particularly describe representative examples of the invention. Furthermore, various features of the above-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Specific examples of the present invention has been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

The invention claimed is:

1. A method for reducing nonuniformity of forward voltage of a semiconductor wafer, which is an N-type semiconductor wafer including impurities which bind to point defects, and having an impurity density being nonuniformly distributed in a plane view of the semiconductor wafer, the method comprising:

irradiating charged particles so that in the plane view an irradiation density of the charged particles irradiated to a first area that includes the impurities at a first density is lower than an irradiation density of the charged particles irradiated to a second area that includes the impurities at a second density that is lower than the first density, such that nonuniformity of complex defects in which the point defects are bound to the impurities is reduced compared to before the irradiation.

2. The method for reducing nonuniformity according to claim 1, wherein the first area is a center of the semiconductor wafer in the plane view and the second area is a peripheral area surrounding the center area.

3. A method for reducing nonuniformity of forward voltage of a semiconductor wafer in which an N-type semiconductor layer and a P-type semiconductor layer are stacked, and a density of impurities included in the N-type semiconductor layer is nonuniformly distributed in a plane view of the semiconductor wafer, wherein the impurities are substances that become complex defects by binding to point defects, the method comprising:

irradiating charged particles so that in the plane view a reaching position of the charged particles irradiated to a first area that includes the impurities at a first density is closer to the P-type semiconductor layer than a reaching position of the charged particles irradiated to a second area that includes the impurities at a second density which is lower than the first density, such that nonuniformity of complex defects in which the point defects are bound to the impurities is reduced compared to before the irradiation.

4. The method for reducing nonuniformity according to claim 3, wherein the first area is a center of the semiconductor wafer in the plane view and the second area is a peripheral area surrounding the center area.

5. The method for reducing nonuniformity according to claim 4, wherein the charged particles are irradiated from an N-type semiconductor layer side through an absorber of which thickness at an area facing the center area is thinner than an area facing the peripheral area.

6. The method for reducing nonuniformity according to claim 4, wherein the charged particles are irradiated from a P-type semiconductor layer side through an absorber of which thickness at an area facing the center area is thicker than an area facing the peripheral area.

7. A semiconductor device manufactured by using a semiconductor wafer in which nonuniformity of forward voltage is reduced by the method according to claim 1.

8. A semiconductor device manufactured by using a semiconductor wafer in which nonuniformity of forward voltage is reduced by the method according to claim 3.

* * * * *